(12) United States Patent
Hsu (10) Patent No.: US 10,846,085 B2
(45) Date of Patent: Nov. 24, 2020

(54) MULTI-LANE DATA PROCESSING CIRCUIT AND SYSTEM

(71) Applicant: SK hynix Inc., Gyeonggi-do (KR)

(72) Inventor: Chin-Sen Hsu, Hsinchu County (TW)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/698,349

(22) Filed: Nov. 27, 2019

(65) Prior Publication Data

US 2020/0326947 A1    Oct. 15, 2020

(30) Foreign Application Priority Data

Apr. 9, 2019  (TW) .............................. 108112382 A (51) Int. Cl.
*G06F 9/30* (2018.01)
*G06F 9/38* (2018.01)
*G06F 30/39* (2020.01)

(52) U.S. Cl.
CPC ........ *G06F 9/30101* (2013.01); *G06F 9/3009* (2013.01); *G06F 9/3012* (2013.01); *G06F 9/3885* (2013.01); *G06F 30/39* (2020.01)

(58) Field of Classification Search
None
See application file for complete search history.

(56) References Cited

U.S. PATENT DOCUMENTS

2017/0201746 A1*  7/2017  An ...................... H04N 17/002
2019/0065430 A1*  2/2019  Kim .................... G06F 13/4068

FOREIGN PATENT DOCUMENTS

KR    1020180092149    8/2018
KR    1020180103907    9/2018

* cited by examiner

*Primary Examiner* — Henry Tsai
*Assistant Examiner* — Aurangzeb Hassan
(74) *Attorney, Agent, or Firm* — IP & T Group LLP (57) ABSTRACT

A multi-lane data processing circuit includes a plurality of lane circuit modules and a plurality of registers. The plurality of lane circuit modules are coupled to a plurality of lanes of a data interface, and include a first lane circuit module and a second lane circuit module, wherein each of the lane circuit modules includes first and second processing circuits. The first processing circuits of the first and second lane circuit modules are electrically coupled, and the second processing circuits of the first and second lane circuit modules are electrically coupled. The plurality of registers include first and second information registers. The first information register is coupled to the first processing circuits of the first and second lane circuit modules, and the second information register is coupled to the second processing circuits of the first and second lane circuit modules.

13 Claims, 10 Drawing Sheets

| 16 | 15 | 14 | 13 | 12 | 11 | 10 | 9 | 8 | 7 | 6 | 5 | 4 | 3 | 2 | 1 | 0 | |
|----|----|----|----|----|----|----|---|---|---|---|---|---|---|---|---|---|---|
| 1 | | | | | | | | | | | | | | | RSD | | |
| 0 | L3S | | ESC_DL | | | | | | L4S | SOF | | | TC=TC0 | | FCT | EOM | 0x10107 |
| 0 | | | DestDeviceID_Enc = 2 | | | | | | | DestCPortID_Enc = 1 | | | | | | | 0x08284 |
| 0 | | | '1' (0x31) | | | | | | | '2' (0x32) | | | | | | | 0x03132 |
| 0 | | | '3' (0x33) | | | | | | | '4' (0x34) | | | | | | | 0x03334 |
| 0 | | | '5' (0x35) | | | | | | | '6' (0x36) | | | | | | | 0x03536 |
| 0 | | | '7' (0x37) | | | | | | | '8' (0x38) | | | | | | | 0x03738 |
| 0 | | | '9' (0x39) | | | | | | | 'A' (0x41) | | | | | | | 0x03941 |
| 0 | | | 'B' (0x42) | | | | | | | 'C' (0x43) | | | | | | | 0x04243 |
| 1 | | | ESC_DL | | | | | | | EOF_EVEN | | | | | | | 0x1012A |
| 0 | | | CCITT CRC-16 = 0x4A20 | | | | | | | | | | | FSN | | | 0x04A20 |

FIG.10

MULTI-LANE DATA PROCESSING CIRCUIT AND SYSTEM

CROSS-REFERENCES TO RELATED APPLICATION

The present application claims priority under 35 U.S.C. § 119(a) to Taiwan application number 108112382, filed on Apr. 9, 2019, in the Taiwan Intellectual Property Office, which is incorporated herein by reference in its entirety.

BACKGROUND

1. Technical Field

Various embodiments generally relate to a data processing circuit and system, and more particularly, to a multi-lane data processing circuit and system.

2. Related Art

In order to satisfy the demand for data interfaces with a relatively large transmission frequency bandwidth, most electronic products employ a serializer/deserializer (SerDes) and multiple lanes to implement a data interface and related circuit inside or outside the electronic products. For the SerDes and the multiple lanes, the electronic products apply a corresponding data processing circuit to perform a necessary process on data which the data interface intends to transmit or receive.

For example, for a multi-lane data processing circuit or communication device, a designer needs to design an electronic product in a plurality of versions whose data interfaces have different transmission frequency bandwidths, due to the product standards or product development. When the multi-lane technology is employed, the designer may arrange a relatively large number of lanes, based on the data interface circuit of the electronic device in a certain version whose transmission frequency bandwidth is relatively small, thereby easily acquiring the data interface circuit of the electronic product in a version whose transmission frequency bandwidth is relatively high.

From the viewpoint of the corresponding data processing circuit, however, the total number of lanes has been already increased. Thus, the designer needs to reconsider how to set the update of the data processing circuit of the electronic product in a version whose transmission frequency bandwidth is small or whether to correct the data processing circuit in order to apply the data processing circuit to the electronic product in a version whose transmission frequency bandwidth is large. Such setting or correction may increase the complexity of the circuit because the setting or correction is likely to be involved in a program such as circuit arrangement within an integrated circuit of a related chip. In the worst case, the designer may have to redesign a proper data processing circuit. In this worst case, when the related version of the electronic product is developed, the efficiency of the development may be affected, and the development cost may be increased.

Thus, when the multi-lane technology is applied, the corresponding data processing circuit used in the electronic product needs to be still improved in terms of expandability.

SUMMARY

Various embodiments are directed to a multi-lane data processing circuit and system, which can be applied to an electronic device employing the multi-lane technology and implement a data processing circuit having a circuit structure with relatively low complexity, thereby satisfying the demand for an electronic product having a plurality of versions in which transmission frequency bandwidths of data interfaces are different from one another.

In an embodiment, there is provided a multi-lane data processing circuit including a plurality of lane circuit modules coupled to a plurality of lanes of a data interface, and comprising a first lane circuit module and a second lane circuit module, wherein each of the lane circuit modules comprises a first processing circuit and a second processing circuit, the first processing circuit of the first lane circuit module has an output terminal coupled to the first processing circuit of the second lane circuit module, and the second processing circuit of the first lane circuit module has an output terminal coupled to the second processing circuit of the second lane circuit module; and a plurality of registers comprising a first information register and a second information register, wherein the first information register has an input terminal coupled to the first processing circuit of the second lane circuit module and an output terminal coupled to the first processing circuit of the first lane circuit module, and the second information register has an input terminal coupled to the second processing circuit of the second lane circuit module and an output terminal coupled to the second processing circuit of the first lane circuit module.

The plurality of lane circuit modules further include a third lane circuit module, wherein the first processing circuit of the second lane circuit module has an output terminal electrically coupled to a first processing circuit of the third lane circuit module, and the second processing circuit of the second lane circuit module has an output terminal electrically coupled to a second processing circuit of the third lane circuit module. The input terminal of the first information register is electrically coupled to the first processing circuit of the second lane circuit module through the first processing circuit of the third lane circuit module; and the input terminal of the second information register is electrically coupled to the second processing circuit of the second lane circuit module through the second processing circuit of the third lane circuit module.

The plurality of lane circuit modules further include a fourth lane circuit module, wherein the first processing circuit of the third lane circuit module has an output terminal electrically coupled to a first processing circuit of the fourth lane circuit module, and the second processing circuit of the third lane circuit module has an output terminal electrically coupled to a second processing circuit of the fourth lane circuit module. The input terminal of the first information register is electrically coupled to the first processing circuit of the second lane circuit module through the first processing circuit of the third lane circuit module and the first processing circuit of the fourth lane circuit module; and the input terminal of the second information register is electrically coupled to the second processing circuit of the second lane circuit module through the second processing circuit of the third lane circuit module and the second processing circuit of the fourth lane circuit module.

Each of the plurality of lane circuit modules further includes a control circuit coupled to the first and second processing circuits corresponding to the lane circuit module. The control circuit corresponding to the lane circuit module selectively enables one or more of the first and second processing circuits corresponding to the lane circuit module according to a lane control signal.

When the lane control signal indicates executing a first process, the control circuits of the plurality of lane circuit modules is enable the first processing circuits of the plurality of lane circuit modules, and couple the first processing circuits of the plurality of lane circuit modules to the plurality of lanes, respectively, and process different data sets of the plurality of lanes in a parallel manner.

In an embodiment, there is provided a multi-lane data processing system including a plurality of physical layer circuit modules coupled to a plurality of lanes of a data interface in a parallel manner; and a multi-lane data processing circuit, wherein the multi-lane data processing circuit comprises: a plurality of lane circuit modules coupled to the plurality of lanes through the plurality of physical layer circuit modules, respectively, and comprising a first lane circuit module and a second lane circuit module, wherein each of the lane circuit modules comprises a first processing circuit and a second processing circuit, the first processing circuit of the first lane circuit module has an output terminal coupled to the first processing circuit of the second lane circuit module, and the second processing circuit of the first lane circuit module has an output terminal coupled to the second processing circuit of the second lane circuit module; and a plurality of registers comprising a first information register and a second information register, wherein the first information register has an input terminal coupled to the first processing circuit of the second lane circuit module and an output terminal coupled to the first processing circuit of the first lane circuit module, and the second information register has an input terminal coupled to the second processing circuit of the second lane circuit module and an output terminal coupled to the first processing circuit of the second lane circuit module.

When the lane control signal indicates executing a first process, the control circuits of the plurality of lane circuit modules enable the first processing circuits of the plurality of lane circuit modules, and couple the first processing circuits of the plurality of lane circuit modules to the plurality of lanes, respectively, through the plurality of physical layer circuit modules and process different data sets of the plurality of lanes in a parallel manner.

The plurality of physical layer circuit modules are transmitter physical layer circuits.

The plurality of physical layer circuit modules are receiver physical layer circuits.

In an embodiment, there is provided a multi-lane data processing system including an N number of lane circuit modules each including M number of processing circuits and respectively configured to receive data from the lanes, each of N and M being 2 or greater; and M number of registers, wherein a Pth one among the registers and a Pth processing circuit among the processing circuits within each of the lane circuit modules are coupled to configure a cascade structure such that the Pth register outputs data into the Pth processing circuit of a first one among the lane circuit modules and the Pth processing circuit of a last one among the lane circuit modules outputs data into the Pth register, wherein each of the processing circuits is configured to process data provided from a previous stage and output the processed data to a following stage, and wherein each of the processing circuits is further configured to receive the data from a corresponding one among the lanes and configured to output the processed data to an external.

DETAILED DESCRIPTION

For full understanding of the purpose, features and effects of the present disclosure, the present disclosure will be described in detail through specific embodiments with reference to the accompanying drawings.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure like reference numerals refer to like parts throughout the various figures and embodiments of the present invention.

Hereafter, various embodiments provide a multi-lane data processing circuit which can be applied to an electronic device employing the multi-lane technology.

In accordance with an embodiment, the multi-lane data processing circuit includes a plurality of lane circuit modules and a plurality of registers.

The plurality of lane circuit modules are coupled to a plurality of lanes of a data interface, for example, first to $N^{th}$ lanes, where N is 2, 3, 4 or more. The plurality of lane circuit modules may include first to $N^{th}$ lane circuit modules for the first to $N^{th}$ lanes. Each of the first to $N^{th}$ lane circuit modules may include first to $M^{th}$ processing circuits, where M is an integer larger than or equal to 2. The first to $M^{th}$ processing circuits may have different processing functions.

The plurality of registers may include first to $M^{th}$ registers. The $P^{th}$ register may use the $P^{th}$ processing circuits within each of the first to $N^{th}$ lane circuit modules to operate when a certain data process is performed, where P is an integer ranging from 1 to M.

In a circuit arrangement, the first processing circuits within each of the first to $N^{th}$ lane circuit modules for the first to $N^{th}$ lanes may be cascaded. Between two adjacent first processing circuits among the first processing circuits of the first to $N^{th}$ lane circuit modules, one processing circuit has an output terminal coupled to an input terminal of the other processing circuit. Among the cascaded first processing circuits of the first to $N^{th}$ lane circuit modules, the first and last ones are coupled to the first register among the first to $M^{th}$ registers. Similarly, the $P^{th}$ processing circuits of the first to $N^{th}$ lane circuit modules for the first to $N^{th}$ lanes may also be cascaded to achieve a circuit arrangement similar to the first processing circuits of the first to $N^{th}$ lane circuit modules.

The above-described embodiment may be applied to an electronic device which employs the multi-lane technology, and implement a data processing circuit having a circuit structure with relatively low complexity, thereby satisfying the demand for an electronic device in a plurality of versions in which the transmission frequency bandwidths of data interfaces are different from one another. When the multi-lane technology is employed, a designer may arrange a relatively large number of lanes according to the data interface circuit of the electronic product in a version whose transmission frequency bandwidth is relatively small, thereby acquiring the data interface circuit of the electronic product in a version whose transmission frequency bandwidth is relatively large. The structure of the multi-lane data processing circuit may be applied to a data processing circuit corresponding to a data interface circuit within an electronic product. The structure of the multi-lane data processing circuit may implement a data processing circuit of a data interface circuit between or among two or more elements or modules within an electronic product.

For example, since an electronic product serving as a data storage device performs a necessary process according to data transmitted or received from the data interface, first to $M^{th}$ processing circuits required for the first to $N^{th}$ lane circuit modules for the respective first to $N^{th}$ lanes in the multi-lane data processing circuit may be arranged. For example, the electronic product performs the process through a hardware circuit, like data processing at a physical layer, a data link layer, a network layer or other levels in the OSI (Open Systems Interconnection) model, or other random necessary data processes, and the present embodiment is not limited thereto.

The first to $N^{th}$ lane circuit modules corresponding to the first to $N^{th}$ lanes in the data interface may be arranged, and the $P^{th}$ processing circuits within the respective first to $N^{th}$ lane circuit modules for the first to $N^{th}$ lanes may be cascaded, where P is an integer ranging from 1 to M. The first and last ones among the cascaded $P^{th}$ processing circuits within the respective first to $N^{th}$ lane circuit modules are arranged so as to be coupled to the $P^{th}$ register among the first to $M^{th}$ registers.

Therefore, the multi-lane data processing circuit may be implemented in an electronic product. In this way, the structure of the multi-lane data processing circuit can satisfy the demand for the circuit arrangement of an electronic product having a plurality of versions in which the magnitudes of the transmission frequency bandwidths of the data interfaces are different from one another. The multi-lane data processing circuit in accordance with the present embodiment may not only have relatively low complexity, but also have excellent expandability, thereby contributing to improving the development efficiency of the electronic product and reducing the development cost of the electronic product.

Hereafter, the multi-lane data processing circuit will be described with reference to a plurality of embodiments as follows.

Figure 1:
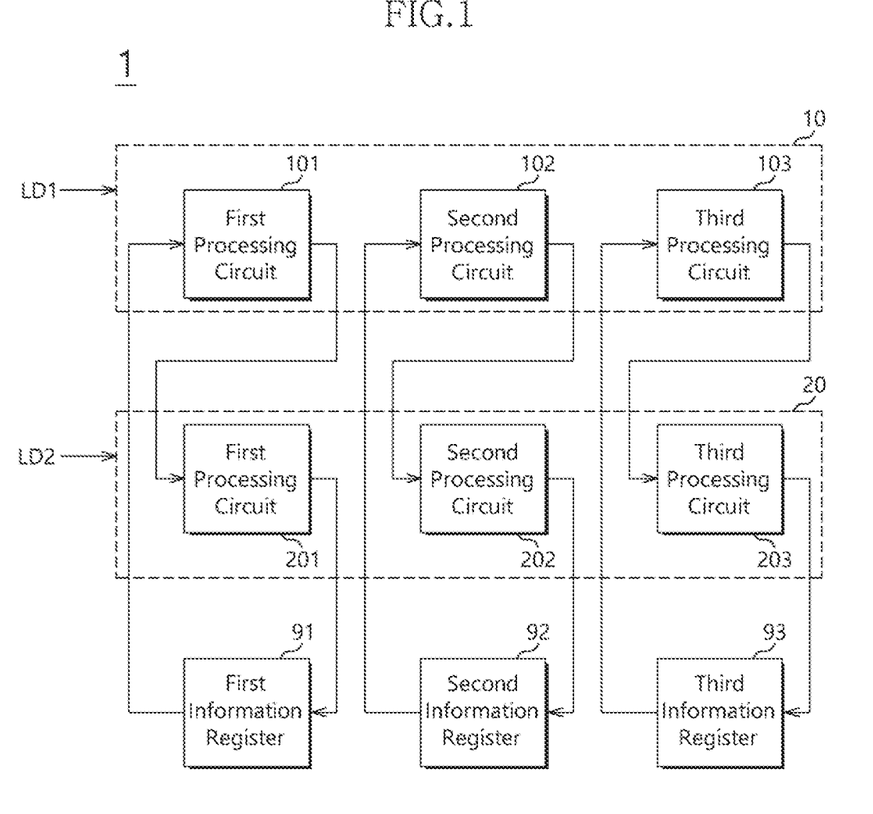
FIG. 1 is a block diagram illustrating an embodiment of a multi-lane data processing circuit.

FIG. 1 is a block diagram illustrating an embodiment of the multi-lane data processing circuit. As illustrated in FIG. 1, a multi-lane data processing circuit 1 includes a plurality of lane circuit modules (for example, 10 and 20) and a plurality of registers (for example, 91, 92 and 93). The plurality of lane circuit modules are coupled to a plurality of lanes of a data interface, for example, two lanes LD1 and LD2, and include the lane circuit module 10 and the lane circuit module 20.

Each of the lane circuit modules includes a first processing circuit (for example, 101 or 201) and a second processing circuit (for example, 102 or 202). In an embodiment, each of the lane circuit modules may further include a third processing circuit (for example, 103 or 203).

Each of the processing circuits within each of the lane circuit modules has an input terminal and an output terminal, and the present embodiment is not limited to the numbers and arrangements of input terminals and output terminals. For example, depending on the necessity of data processing, the processing circuit may have one or more input terminals which are disposed to receive data of the corresponding lane or to receive an output from another processing circuit, and have one or more output terminals which are disposed to output data to a corresponding register among the first to $M^{th}$ registers or output data to an input terminal of another processing circuit, or to be used as an output terminal for the corresponding lane of the $P^{th}$ processing circuit. Here, P is an integer ranging from 1 to M. As illustrated in FIG. 1, the first processing circuit 101 of the lane circuit is module 10 has an output terminal coupled to the first processing circuit 201 of the lane circuit module 20, the second processing circuit 102 of the lane circuit module 10 has an output terminal coupled to the second processing circuit 202 of the lane circuit module 20, and the third processing circuit 103 of the lane circuit module 10 has an output terminal coupled to the third processing circuit 203 of the lane circuit module 20.

The first to $M^{th}$ registers include a first information register 91 and a second information register 92. The first information register 91 has an input terminal coupled to the first processing circuit 201 of the lane circuit module 20, and an output terminal coupled to the firstsss processing circuit 101 of the lane circuit module 10. The second information register 92 has an input terminal coupled to the second processing circuit 202 of the lane circuit module 20, and an output terminal coupled to the second processing circuit 102 of the lane circuit module 10. In an embodiment, the plurality of registers may further include a third information register 93, and the third information register 93 has an input terminal coupled to the third processing circuit 203 of the lane circuit module 20, and an output terminal coupled to the third processing circuit 103 of the lane circuit module 10.

Figure 2:
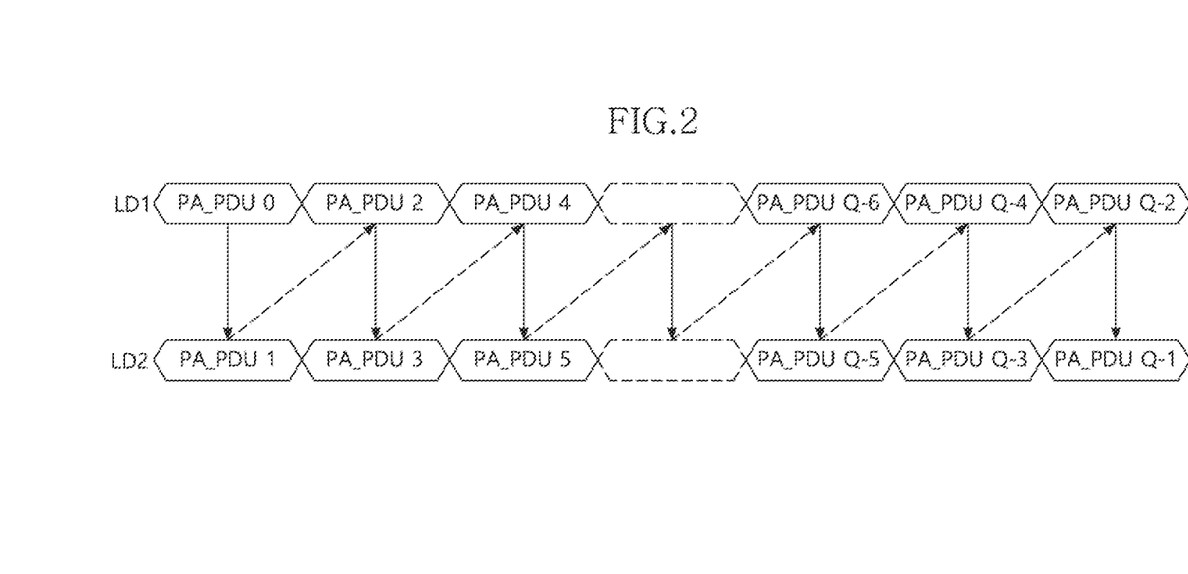
FIG. 2 is a diagram for describing an embodiment in which data are processed in parallel through the multi-lane data processing circuit of FIG. 1.

FIG. 2 is a diagram for describing an embodiment in which data are processed in parallel through the multi-lane data processing circuit of FIG. 1. As illustrated in FIG. 2, Q data sets represented by PA_PDU0 to PA_PDUQ-1 are inputted to the multi-lane data processing circuit 1 of FIG. 1 in a parallel manner through the two lanes LD1 and LD2 of the data interface, such that the data are processed in parallel. Here, Q is an integer larger than or equal to 2. Referring to FIGS. 1 and 2, the data sets PA_PDU0 and PA_PDU1 of the data sets PA_PDU0 to PA_PDUQ-1 are inputted to the lane circuit modules 10 and 20 in a parallel manner to process the data. Then, the data sets PA_PDU2 and PA_PDU3 are inputted to the lane circuit modules 10 and 20 in a parallel manner to process the data. In this way, the last data sets PA_PDUQ-2 and PA_PDUQ-1 are also inputted to the lane circuit modules 10 and 20 in a parallel manner to process the data. Through such a process, the data processing efficiency may be improved.

Figure 3:
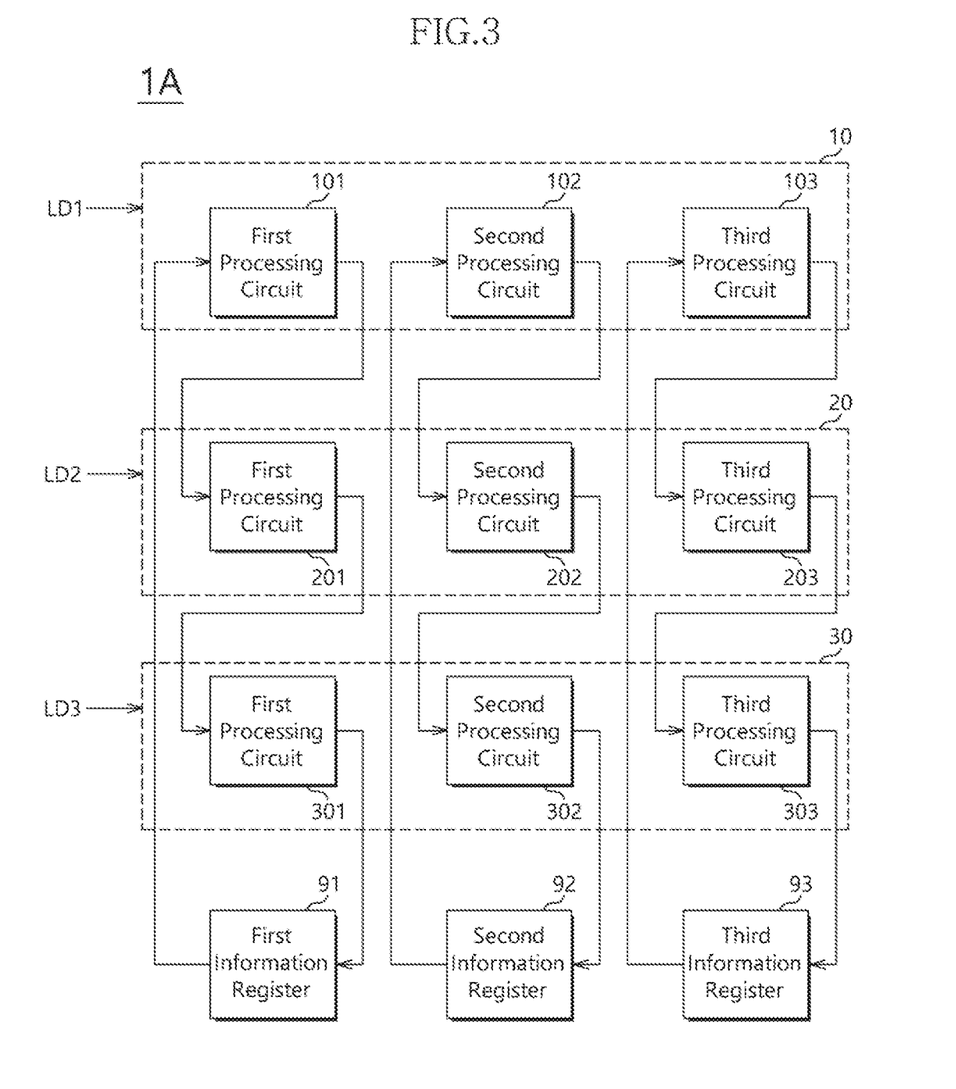
FIG. 3 is a block diagram illustrating another embodiment of the mufti-lane data processing circuit of FIG. 1.

FIG. 3 is a block diagram illustrating another embodiment of the multi-lane data processing circuit of FIG. 1. As illustrated in FIG. 3, a multi-lane data processing circuit 1A of FIG. 3 may further include a lane circuit module 30, when compared to the multi-lane data processing circuit 1 of FIG. 1, which includes the lane circuit module 10 and 20. The multi-lane data processing circuit 1A may be applied to an electronic product which employs a data interface for three lanes.

As illustrated in FIG. 3, the first processing circuit 201 of the lane circuit module 20 has an output terminal coupled to a first processing circuit 301 of the lane circuit module 30, and the second processing circuit 202 of the lane circuit module 20 has an output terminal coupled to a second processing circuit 302 of the lane circuit module 30. In an embodiment, the third processing circuit 203 of the lane circuit module 20 has an output terminal coupled to a third processing circuit 303 of the lane circuit module 30.

As illustrated in FIG. 3, the input terminal of the first information register 91 is coupled to the first processing circuit 301 of the lane circuit module 30. When compared to FIG. 1, the input terminal of the first information register 91 is coupled to the first processing circuit 201 of the lane circuit module 20 through the first processing circuit 301 of the lane circuit module 30, and the input terminal of the second information register 92 is coupled to the second processing circuit 302 of the lane circuit module 30. When compared to FIG. 1, the input terminal of the second information register 92 is coupled to the second processing circuit 202 of the lane circuit module 20 through the second processing circuit 302 of the lane circuit module 30. In an embodiment, the input terminal of the third information register 93 is coupled to the third processing circuit 303 of the lane circuit module 30. When compared to FIG. 1, the input terminal of the third information register 93 is coupled to the third processing circuit 203 of the lane circuit module 20 through the third processing circuit 303 of the lane circuit module 30.

Figure 4:
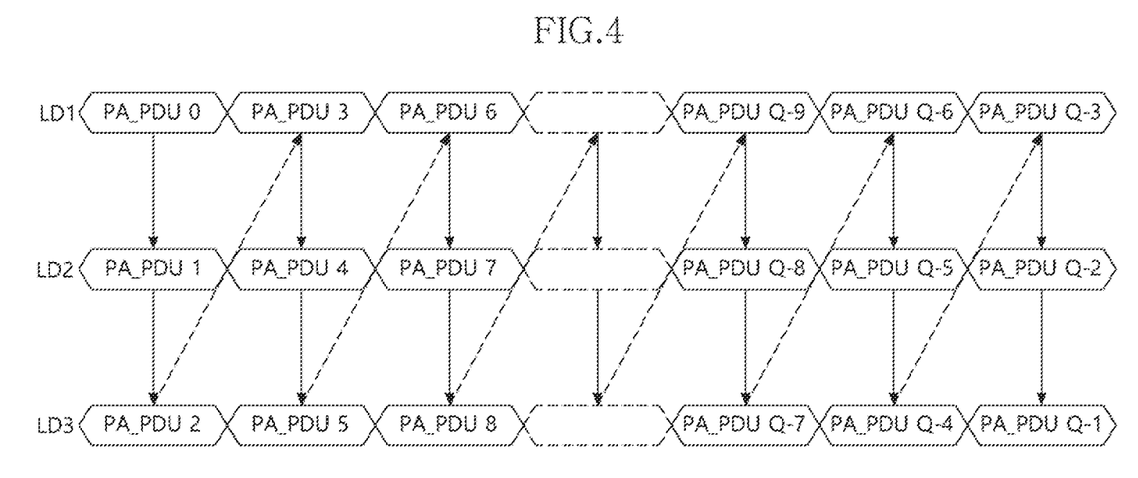
FIG. 4 is a diagram for describing an embodiment in which data are processed in parallel through the multi-lane data processing circuit of FIG. 3.

FIG. 4 is a diagram for describing an embodiment in which data are processed in parallel through the multi-lane data processing circuit of FIG. 3. Referring to FIG. 4, Q data sets represented by PA_PDU0 to PA_PDUQ-1 are inputted to the multi-lane data processing circuit 1A of FIG. 3 in a parallel manner through three lanes LD1, LD2 and LD3 of the data interface, such that the data are processed in parallel. Here, Q is an integer larger than or equal to 3. Referring to FIGS. 3 and 4, the data sets PA_PDU0 to PA_PDU2 among the data sets PA_PDU0 to PA_PDUQ-1 are inputted to the lane circuit modules 10, 20 and 30 in a parallel manner to process the data. Then, the data sets PA_PDU3 to PA_PDU5 are inputted to the lane circuit modules 10, 20 and 30 in a parallel manner to process the data. In this way, the last data sets PA_PDUQ-3 to PA_PDUQ-1 are also inputted to the lane circuit modules 10, 20 and 30 in a parallel manner to process the data. Through such a process, the data processing efficiency can be improved.

Figure 5:
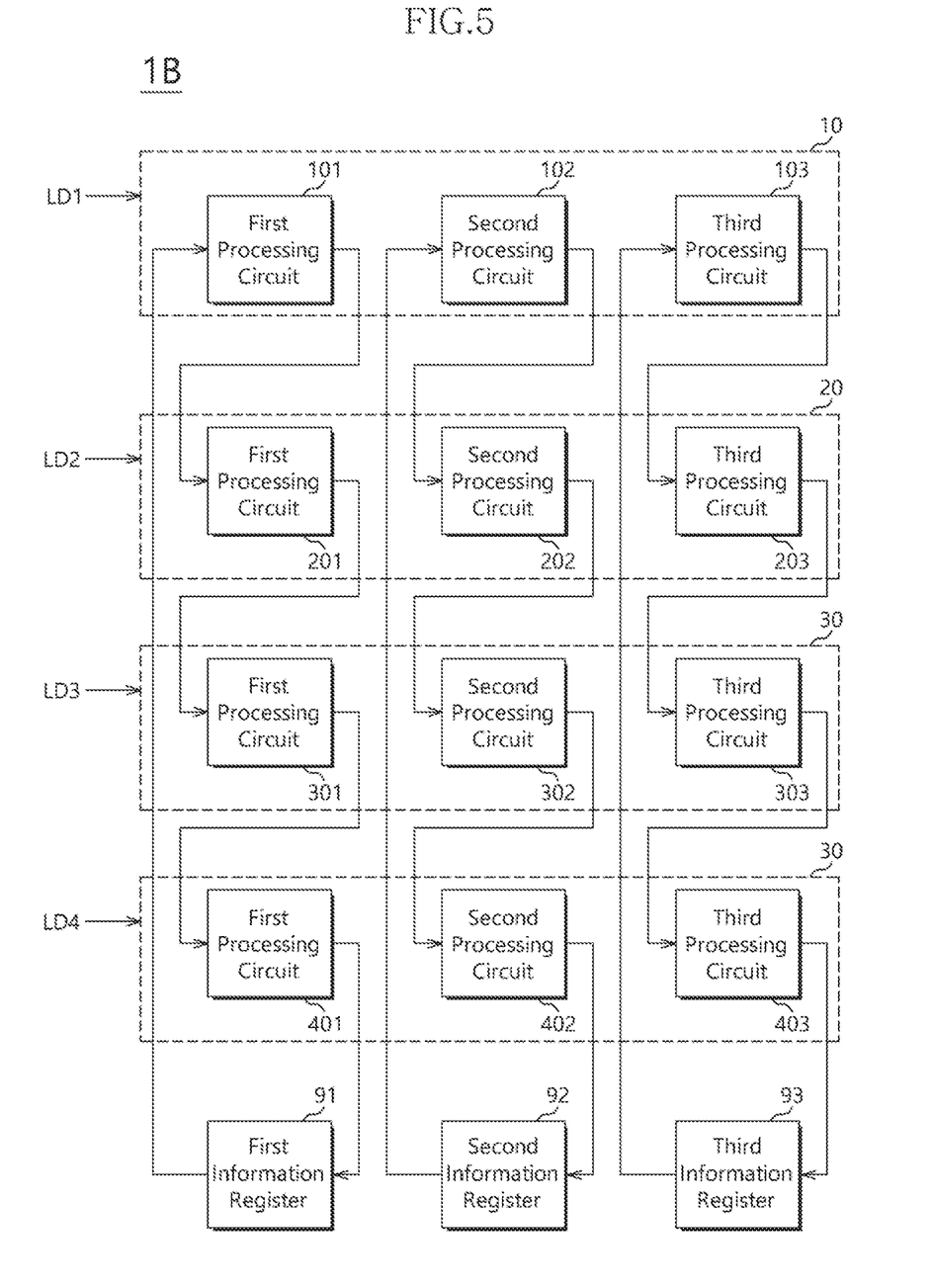
FIG. 5 is a block diagram illustrating still another embodiment of the multi-lane data processing circuit of FIG. 1.

FIG. 5 is a block diagram illustrating still another embodiment of the multi-lane data processing circuit of FIG. 1. As illustrated in FIG. 5, a multi-lane data processing circuit 1B of FIG. 5 may further include a lane circuit module 40, when compared to the multi-lane data processing circuit 1A of FIG. 3, which includes the lane circuit modules 10, 20, and 30. The multi-lane data processing circuit 1B may be applied to an electronic product which employs a data interface for four lanes.

As illustrated in FIG. 5, the first processing circuit 301 of the lane circuit module 30 has an output terminal coupled to a first processing circuit 401 of the lane circuit module 40, and the second processing circuit 302 of the lane circuit module 30 has an output terminal coupled to a second processing circuit 402 of the lane circuit module 40. In an embodiment, the third processing circuit 303 of the lane circuit module 30 has an output terminal electrically coupled to a third processing circuit 403 of the lane circuit module 40.

As illustrated in FIG. 5, the input terminal of the first information register 91 is coupled to the first processing circuit 401 of the lane circuit module 40. When compared to FIG. 1, the input terminal of the first information register 91 is coupled to the first processing circuit 201 of the lane circuit module 20 through the first processing circuit 401 of the lane circuit module 40 and the first processing circuit 301 of the lane circuit module 30, and the input terminal of the second information register 92 is coupled to the second processing circuit 402 of the lane circuit module 40. When compared to FIG. 1, the input terminal of the second information register 92 is coupled to the second processing circuit 202 of the lane circuit module 20 through the second processing circuit 402 of the lane circuit module 40 and the second processing circuit 302 of the lane circuit module 30. In an embodiment, the input terminal of the third information register 93 is coupled to the third processing circuit 403 of the lane circuit module 40. When compared to FIG. 1, the input terminal of the third information register 93 is coupled to the third processing circuit 203 of the lane circuit module 20 through the third processing circuit 403 of the lane circuit module 40 and the third processing circuit 303 of the lane circuit module 30.

Figure 6:
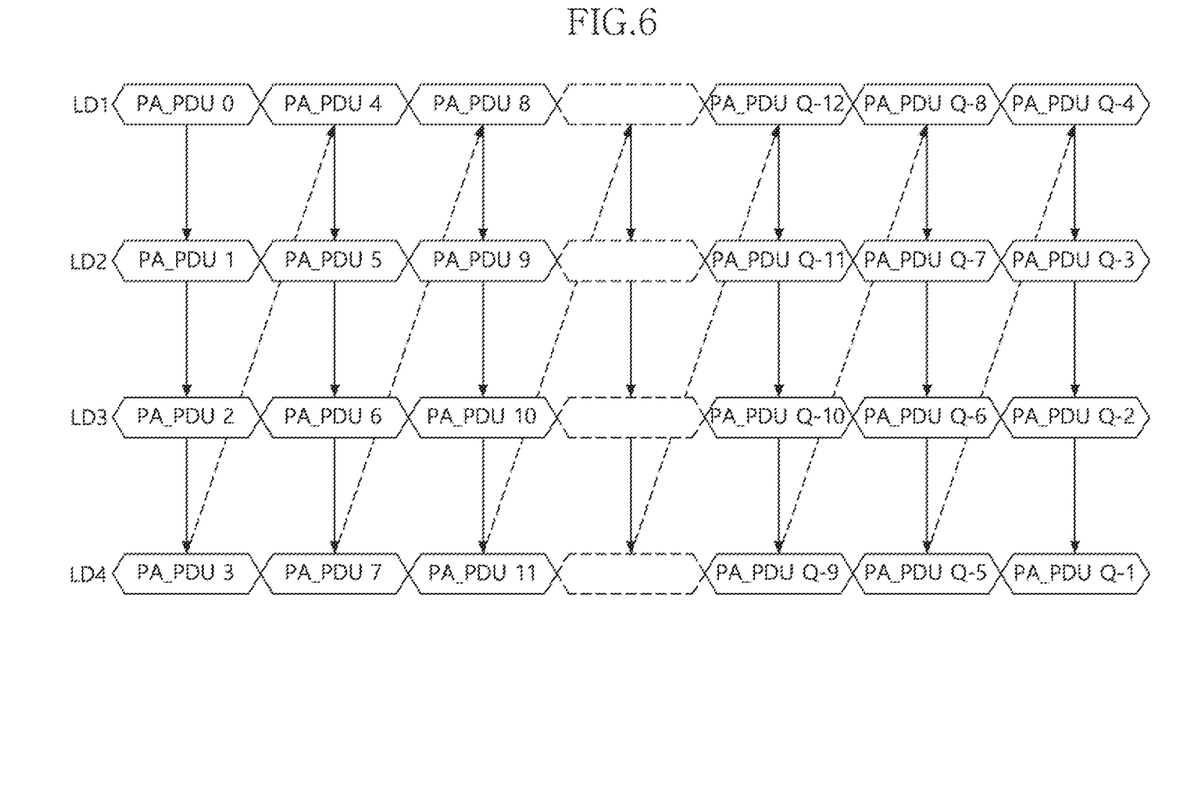
FIG. 6 is a diagram for describing an embodiment in which data are processed in parallel through the multi-lane data processing circuit of FIG. 5.

FIG. 6 is a diagram for describing an embodiment in which data are processed in parallel through the multi-lane data processing circuit of FIG. 5. Referring to FIG. 6, Q data sets represented by PA_PDU0 to PA_PDUQ-1 are inputted to the multi-lane data processing circuit 1B of FIG. 5 in a parallel manner through four lanes LD1 to LD4 of the data interface, such that the data are processed in parallel. Here, Q is an integer larger than or equal to 4. Referring to FIGS. 5 and 6, the data sets PA_PDU0 to PA_PDU3 among the data sets PA_PDU0 to PA_PDUQ-1 are inputted to the lane circuit modules 10, 20, 30 and 40 in a parallel manner to process the data. Then, the data sets PA_PDU4 to PA_PDU7 are inputted to the lane circuit modules 10, 20, 30 and 40 in a parallel manner to process the data. In this way, the last data sets PA_PDUQ-4 to PA_PDUQ-1 are also inputted to the lane circuit modules 10, 20, 30 and 40 in a parallel manner to process the data. Through such a process, the data processing efficiency may be improved.

Figure 7:
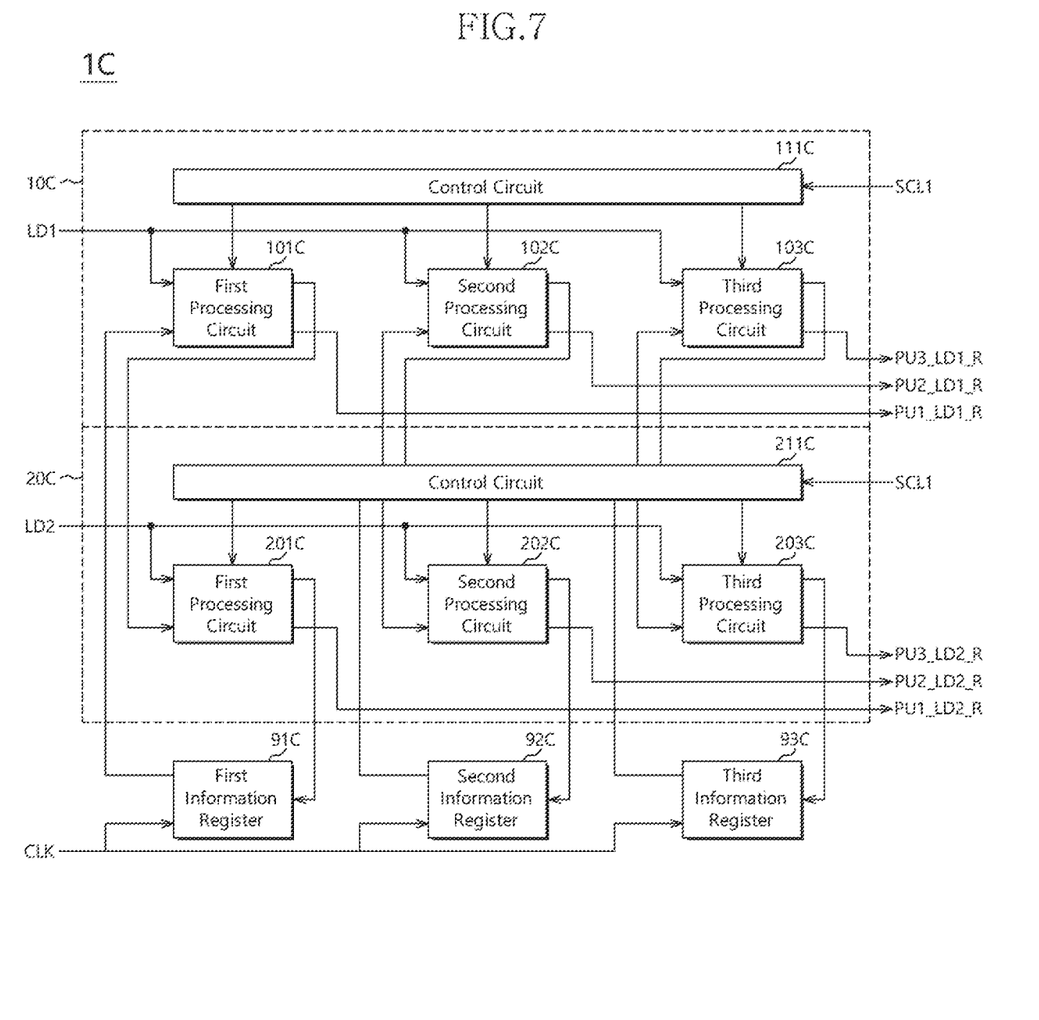
FIG. 7 is a block diagram illustrating an embodiment for implementing various data processing methods through the multi-lane data processing circuit of FIG. 1.

FIG. 7 is a block diagram illustrating an embodiment for implementing various data processing methods through the multi-lane data processing circuit of FIG. 1. As illustrated in FIG. 7, a multi-lane data processing circuit 1C includes a plurality of lane circuit modules (for example, 10C and 20C) and a plurality of registers (for example, 91C, 92C and 93C). The plurality of lane circuit modules are coupled to a plurality of lanes of the data interface, for example, two lanes LD1 and LD2, and include the lane circuit module 10C and the lane circuit module 20C. Each of the lane circuit modules includes a first processing circuit (for example, 101C or 201C) and a second processing circuit (for example, 102C or 202C). In an embodiment, each of the lane circuit modules may further include a third processing circuit (for example, 103C or 203C).

The first processing circuit 101C or 201C includes two or more input terminals. As illustrated in FIG. 7, one input terminal of the first processing circuit 101C serves to receive data from the lane LD1, and the other input terminal of the first processing unit 101C serves to receive an output from the first information register 91C. One input terminal of the first processing circuit 201C serves to receive data from the lane LD2, and the other input terminal of the first processing circuit 201C serves to receive processed data from the first processing circuit 101C.

The first processing circuit 101C or 201C includes two or more output terminals. As illustrated in FIG. 7, one output terminal of the first processing circuit 101C serves to transmit processed data of the first processing circuit 101C to the first processing circuit 201C, and the other output terminal of the first processing circuit 101C serves to output a process result (for example, represented by PU1_LD1_R) of the first processing circuit 101C such that a subsequent circuit of an electronic product uses or processes the process result.

One output terminal of the first processing circuit 201C serves to output processed data of the first processing circuit 201C to the first information register 91C, and the outer output terminal of the first processing circuit 201C serves to output a process result (for example, represented by PU1_LD2_R) of the first processing circuit 201C such that a subsequent circuit of the electronic product uses or processes the process result. The second processing circuit 102C or 202C or the third processing circuit 103C or 203C may also be implemented in a similar manner.

As illustrated in FIG. 7, process results of the second processing circuits 102C and 202C are represented by PU2_LD1_R and PU2_LD2_R, respectively, and process results of the third processing circuits 103C and 203C are represented by PU3 and PU3_LD2_R, respectively.

The plurality of registers 91C to 93C of the multi-lane data processing circuit 1C illustrated in FIG. 7 are controlled by a clock signal CLK.

As illustrated in FIG. 7, in an embodiment, each of the lane circuit modules may further include a control circuit (for example, 111C or 211C), and the control circuit is coupled to the plurality of processing circuits corresponding to the lane circuit module. For example, in FIG. 7, the control circuit 111C is coupled to the first processing circuit 101C, the second processing circuit 102C and the third processing circuit 103C, which correspond to the lane circuit module 10C, and the control circuit 211C is coupled to the first processing circuit 201C, the second processing circuit 202C and the third processing circuit 203C, which correspond to the lane circuit module 20C. The control circuit corresponding to the lane circuit module selectively enables or disables one or more of the plurality of processing circuits corresponding to the lane circuit module according to a lane control signal (for example, SCL1 or SCL2). For example, in FIG. 7, the control circuit 111C selectively enables or disables one or more of the first processing circuit 101C, the second processing circuit 102C and the third processing circuit 103C, which correspond to the lane circuit module 10C, according to the lane control signal SCL1. The control circuit 211C may also be similarly applied to the lane circuit module 20C.

In the embodiment of FIG. 7, the first processing circuits 101C and 201C are implemented with a CRC (Cyclic Redundancy Check) circuit. The CRC is a kind of hash function for generating a verification code having a small and fixed number of bits according to data such as a network data frame, packet or computer file. For example, the CRC serves to detect or check an error which may occur after data are transmitted or stored. When there are data to be transmitted or stored, the first processing circuit may compute a check code through the CRC, and attach the check code to the rear of the data. Then, the first processing circuit in a receiver side may perform the same CRC operation and check whether the check codes coincide with each other, in order to check whether a change occurred in the data. For example, the first processing circuits 101C and 201C are implemented with a CRC circuit which conforms to the international standard CCITT CRC-16.

The second processing circuit 102C or 202C may implement another kind of data processing. For example, the second processing circuit 102C or 202C may calculate a data flow rate or the sum total of packets or frames in the data interface. The third processing circuit 103C or 203C may implement still another kind of data processing. However, the present embodiment is not limited to such examples.

Referring back to FIG. 7, when the lane control signal SCL1 or SCL2 indicates executing a first process, the control circuits 111C and 211C of the plurality of lane circuit modules 10C and 20C enable the first processing circuits 101C and 201C of the plurality of lane circuit modules, and couple the first processing circuits 101C and 201C of the plurality of lane circuit modules to the respective lanes LD1 and LD2 to process different data sets of the plurality of lanes in a parallel manner. For example, the lane control signal may indicate enabling the first processing circuit, and disabling the second and third processing circuits.

The lane control signal may also indicate a different combination to enable or disable one or more processing circuits in the lane circuit module corresponding to the same lane. For example, when the lane control signal SCL1 or SCL2 indicates executing the first process and a second process, the first and second processing circuits of the plurality of lane circuit modules execute the first and second processes. Furthermore, the CRC is performed through the first processing circuit, and other data processes, for example, a process of calculating a data flow rate or the sum total of packets or frames in the data interface, are simultaneously performed though the second processing circuit.

Figure 8:
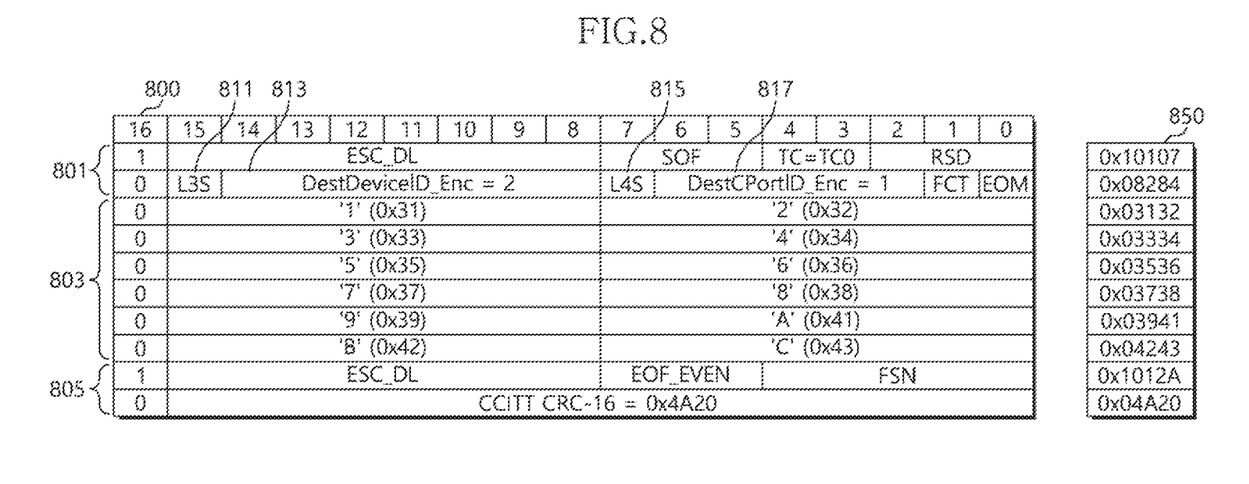
FIG. 8 is a diagram for describing an embodiment of a protocol data unit processed through the multi-lane data processing circuit of FIG. 7.

FIG. 8 is a diagram for describing an embodiment of a PDU (Protocol Data Unit) which is processed by the multi-lane data processing circuit of FIG. 7. As illustrated in FIG. 8, a block 800 represents a frame or packet including data characters 1 to 9, A, B and C. Furthermore, a block 850 represents data sets expressed as a plurality of hexadecimal codes corresponding to such a frame, and includes data sets 0x1017 to 0x1012A and 0x04A20, for example. Among the data sets, the last data set 0x04A20 is a check code generated through the CRC based on CCITT CRC-16, which is performed on the data sets from 0x1017 to 0x1012A.

Here, suppose that the block 850 serving as the data sets expressed as the plurality of hexadecimal codes corresponding to such a frame is transmitted to the receiver side from the transmitter side, and the multi-lane data processing circuit 1C of FIG. 7 in the receiver side verifies the accuracy of the data.

Figure 9:
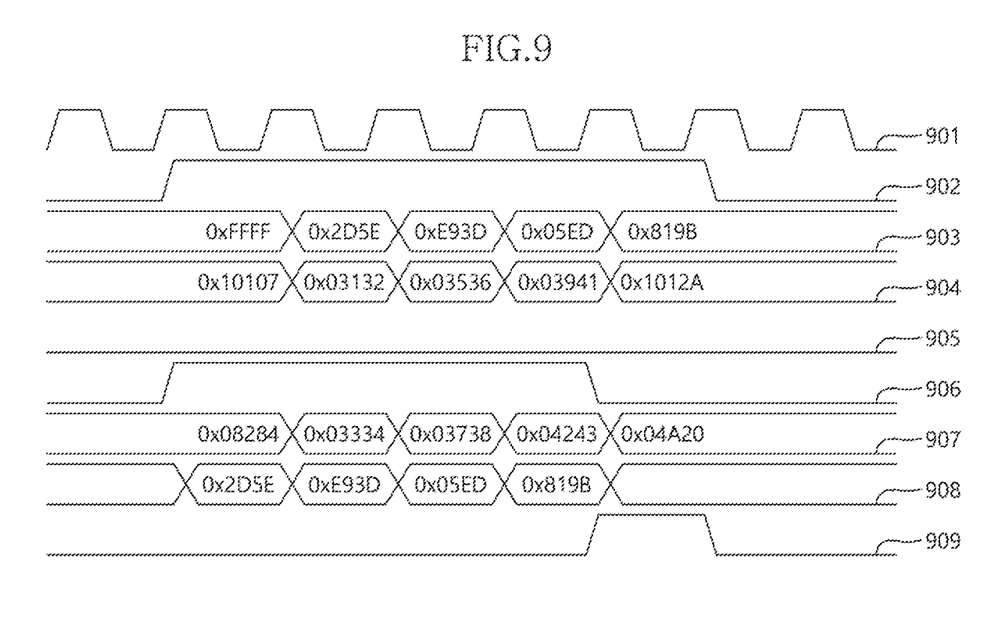
FIG. 9 is a signal diagram illustrating an embodiment for implementing CRC (Cyclic Redundancy Check) using the multi-lane data processing circuit of FIG. 7.

FIG. 9 is a signal diagram illustrating an embodiment in which the CRC is implemented through the multi-lane data processing circuit of FIG. 7. As illustrated in FIGS. 7, 8 and 9, the plurality of data sets of the frame represented by the block 850 are inputted to the multi-lane data processing circuit 1C of FIG. 7 in a parallel manner through the two lanes LD1 and LD2 of the data interface, under the clock signal CLK represented by a signal 901, in order to process the data in parallel. As indicated by signals 904 and 907, two data sets (for example, 0x10107 and 0x08284) of the frame represented by the block 850 are inputted to the first processing circuit 101C of the lane circuit module 10C and the first processing circuit 201C of the lane circuit module 20C in a parallel manner to process the data. Then, two data sets (for example, 0x03132 and 0x03334) are inputted to the first processing circuits 101C and 201C in a parallel manner to process the data. In this way, the last two data sets (for example, 0x1012A and 0x04A20) are also inputted to the first processing circuits 101C and 201C in a parallel manner to process the data.

As illustrated in FIG. 9, the control circuits 111C and 211C output signals 902 and 906 to the first processing circuits 101C and 201C and selectively enable the first processing circuits 101C and 201C to process the data, according to the lane control signals SCL1 and SCL2 under the clock signal CLK represented by the signal 901. The high level of the signals 902 and 906 represents enable, and the low level of the signals 902 and 906 represents disable.

Data of the output terminal and input terminal of the first information register 91C are represented by signals 903 and 908, respectively, and 0xFFFF of the data represents initial value of the output terminal of the first information register 91C.

The process results PU1_LD1_R and PU1_LD2_R of the first processing circuits 101C and 201C are represented by signals 905 and 909, respectively. As illustrated in FIG. 9, the signal 909 corresponding to the process result PU1_LD2_R of the first processing circuit 201C is expressed as an accurate pulse wave signal (for example, high level) at the last output of the computation, because an accurate result is obtained through the CRC. However, the present embodiment is not limited to such an example.

For example, the frame of the block 800 may be data processed by various layers such as a transport layer, a network layer and/or a data link layer, but the present disclosure is not limited thereto. As illustrated in FIG. 8, the block 800 represents data included in the frame as an example. For example, the block 800 includes a header 801, a body 803 and a footer 805. The header 801 includes fields ESC_DL, SOF, TC and RSD. ESC_DL represents a special code for distinguishing between a control code and a data code, and SOF represents a code indicating that such a control code starts one new frame. TC defines an information flow rate or priority, and is set to one of a plurality of different information flow rates, for example, TC0. RSD represents a reserved field. The header 801 may further include a network layer indication 811 and network layer information 813. When the network layer indication 811 (represented by L3S, for example) is set to 1, for example, it indicates that the frame includes information of the network layer L3. The network layer information 813 (represented by DestDeviceID_ENC, for example), which is an identification code ID or address of a destination device, indicates a device to which this protocol data unit is to be transmitted. The header 801 further includes a transport layer indication value 815 (represented by L4S, for example) indicating that the transport layer information (Le. L4) is also present in the protocol data unit. The header 801 includes a port identification value 817 (represented by DestCPortID_ENC, for example) which decides to which port of the destination device the data for the L4 information corresponds, and further includes a flow rate control beacon bit (represented by FCT, for example) for the L4 information. End-to-end connection may be identified based on DestCPortID_ENC and DestDeviceID_ENC. The header 801 may further include an end bit (represented by EOM, for example) indicating whether such a frame is the last message of the transport layer. The body 803 includes user or application data to be transmitted. The footer 805 may include a check code generated through the CRC based on CCITT CRC-16, and further include fields ESC_DL, EOF_EVEN and FSN. EOF_EVEN represents the last control code of the frame, and FSN represents a frame serial number which is a serial number while the data link layer is transmitting. However, the present embodiment is not limited to such an example.

In some embodiments, the multi-lane data processing circuit 1C of FIG. 7 may be additionally expanded into a multi-lane data processing circuit suitable for three lanes, four lanes, or other numbers of lanes by referring to the circuit arrangement of FIG. 3 or 5, in order to increase the data frequency bandwidth. Thus, the multi-lane data processing circuit may satisfy the requirement for a data frequency bandwidth of an electronic product which is implemented based on the multi-lane data processing circuit.

Figure 10:
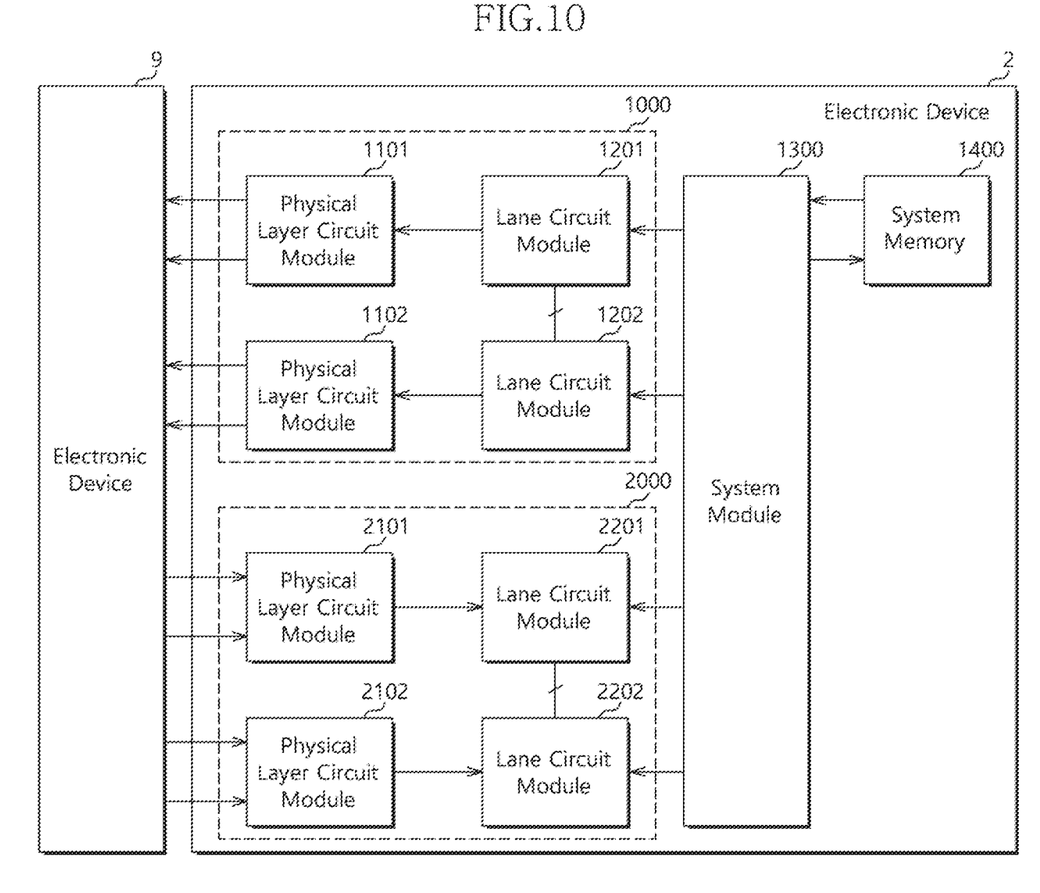
FIG. 10 is a block diagram illustrating an embodiment in which an electronic device includes a multi-lane data processing system.

FIG. 10 is a block diagram illustrating an embodiment in which a multi-lane data processing system of an electronic device is used. As illustrated in FIG. 10, an electronic device 2 and an electronic device 9 perform communication or data transmission, and the electronic device 2 is a data interface based on multiple lanes (two or more lanes), and includes a multi-lane data processing system (for example, 1000 or 2000). The electronic device 2 is a data processing circuit, a communication device, a storage device or the like, the electronic device 9 is a smart phone, a wearable device, a tablet computer, a notebook computer, a desktop computer, a server or other random computing devices, and the data interface is USB, SATA or another random suitable data interface installed inside or outside a computer. The electronic device 2 and the electronic device 9 may be implemented as a part of an electronic system. As illustrated in FIG. 10, the electronic device 2 includes a system module 1300 and a system memory 1400. For example, the electronic device 2 may be implemented as a memory device such as a memory card or a storage device such as a solid state hard disk, and the electronic device 9 may be implemented as network equipment. In some embodiments, the electronic device 2 and the electronic device 9 may be implemented as two or more elements or modules inside an electronic product. However, the present embodiment is not limited to such an example.

The multi-lane data processing system 1000 or 2000 includes a plurality of physical layer circuit modules (for example, 1101 and 1102 or 2101 and 2102) and a multi-lane data processing circuit. The multi-lane data processing circuit includes a plurality of lane circuit modules (for example, 1201 and 1202 or 2202 and 2202) and a plurality of registers. When the plurality of lane circuit modules 1201 and 1202 or 2201 and 2202 and the plurality of registers are the plurality of lane circuit modules and the plurality of registers, which correspond to at least one of the plurality of embodiments (for example, FIGS. 1, 3, 5 and 7) of the above-described multi-lane data processing circuit or combinations thereof, the plurality of lane circuit modules are electrically coupled to the respective lanes through the plurality of physical layer circuit modules. Each of the lanes is configured to transmit a differential signal pair, for example.

In an embodiment, when the lane control signal indicates executing any one process, the control circuits of the plurality of lane circuit modules enable the plurality of lane circuit modules and the circuit processing circuits corresponding to the process, couple the plurality of lane circuit modules and the processing circuits corresponding to the process to multiple lanes through the plurality of physical layer circuit modules, respectively, and process different data sets of the multiple lanes in a parallel manner, as illustrated in the embodiment of FIG. 2, 4, 6 or 9.

As illustrated in FIG. 10, in an embodiment, the plurality of physical layer circuit modules (for example, 1101 and 1102) are transmitter physical layer circuits. In an embodiment, the plurality of physical layer circuit modules 2101 and 2102 are receiver physical layer circuits. In FIG. 10, each of the transmitter stage and the receiver stage in the electronic device 2 uses two lanes. However, the present embodiment is not limited to such an example. In some embodiments, the electronic device 2 may be configured in such a manner that each of the transmitter stage and the receiver stage uses a first number of lanes and a second number of lanes. The first number and the second number may be equal to or different from each other, and at least one of the first and second numbers may be equal to or more than 2. In accordance with the embodiments of the multi-lane data processing circuits in FIGS. 1, 3, 5 and 7, the data processing circuit suitable for the electronic device in accordance with the present embodiment may be implemented.

For example, referring to FIGS. 7 to 9 and the related embodiments, the physical layer circuit modules 2101 and 2102 of FIG. 10 may be configured to process data sets from two or more lanes (see FIGS. 8 and 9). Then, the physical layer circuit modules 2101 and 2102 may transmit the processed data sets to the lane circuit modules 2201 and 2202 which are implemented in accordance with the embodiment of FIG. 7, in order to perform the CRC in accordance with the above-described embodiment or perform the CRC and the calculation of the data flow rate and the sum total of packets or frames, in parallel. Similarly, the lane circuit modules 1201 and 1202 of FIG. 10 may be configured to process data sets of two or more lanes, provided from the system module 1300. Then, the lane circuit modules 1201 and 1202 may transmit the data processed through the CRC or the like to the physical layer circuit modules 1101 and 1102, in order to transmit the data to the lanes.

Therefore, the data processing circuit, which can be applied to an electronic device which employs the multi-lane technology and has a circuit structure with relatively low complexity, can be implemented to provide various embodiments of the multi-lane data processing circuit and system, which can satisfy the demand for electronic products having a plurality of versions in which the transmission frequency bandwidths of the data interfaces are different from one another. The multi-lane data processing circuit and system in accordance with the present embodiment may have not only relatively low complexity, but also excellent expandability, thereby contributing to improving the development efficiency of the electronic product and reducing the development cost of the electronic product.

In the embodiments related to the multi-lane data processing circuit, one or more of the multi-lane data processing circuit, the lane circuit module, the processing circuit, the information register and the control circuit may be implemented with one or more logic gates, logic circuits, digital circuits or other circuits, implemented with a programmable integrated circuit such as an FPGA (Field Programmable Gate Array) or a circuit such as an ASIC (Application Specific Integrated Circuit), or implemented with a dedicated circuit or module. However, the present embodiment is not limited to such examples.

Therefore, the above-described embodiments can be applied to an electronic device which employs the multi-lane technology, and the data processing circuit having a circuit structure with relatively low complexity may be implemented to provide various embodiments of the multi-lane data processing circuit and system, which can satisfy the demand for the electronic product having a plurality of versions in which the transmission frequency bandwidths of the data interfaces are different from one another. The multi-lane data processing circuit and system in accordance with the present embodiment may have not only relatively low complexity, but also excellent expandability, thereby contributing to improving the development efficiency of the electronic product and reducing the development cost of the electronic product.

While various embodiments have been described above, it will be understood to those skilled in the art that the embodiments described are examples only. Accordingly, the multi-lane data processing circuit and system described herein should not be limited based on the described embodiments.

What is claimed is:

1. A multi-lane data processing circuit comprising:
a plurality of lane circuit modules coupled respectively to a plurality of lanes of a data interface,
a plurality of registers configured to be connected to the plurality of lane circuit modules; and
a plurality of control circuits comprised in each of the plurality of lane circuit modules and configured to control corresponding lane circuit module,
wherein the plurality of lane circuit modules comprise a first lane circuit module and a second lane circuit module, each of the lane circuit modules comprises a first processing circuit and a second processing circuit, the first processing circuit of the first lane circuit module has an output terminal coupled to an input terminal of the first processing circuit of the second lane circuit module, and the second processing circuit of the first lane circuit module has an output terminal coupled to an input terminal of the second processing circuit of the second lane circuit module, and
wherein the plurality of registers comprise a first information register and a second information register, the first information register has an input terminal coupled to an output terminal of the first processing circuit of the second lane circuit module and an output terminal coupled to an input terminal of the first processing circuit of the first lane circuit module, and the second information register has an input terminal coupled to an output terminal of the second processing circuit of the second lane circuit module and an output terminal coupled to an input terminal of the second processing circuit of the first lane circuit module.

2. The multi-lane data processing circuit according to claim 1,
wherein the plurality of lane circuit modules further comprises a third lane circuit module,
wherein the first processing circuit of the second lane circuit module has an output terminal coupled to an input terminal of a first processing circuit of the third lane circuit module, and the second processing circuit of the second lane circuit module has an output terminal coupled to an input terminal of a second processing circuit of the third lane circuit module, wherein the input terminal of the first information register is coupled to the first processing circuit of the second lane circuit module through the first processing circuit of the third lane circuit module, and wherein the input terminal of the second information register is coupled to the second processing circuit of the second lane circuit module through the second processing circuit of the third lane circuit module.

3. The multi-lane data processing circuit according to claim 2, wherein the plurality of lane circuit modules further comprises a fourth lane circuit module, wherein the first processing circuit of the third lane circuit module has an output terminal coupled to an input terminal of a first processing circuit of the fourth lane circuit module, and the second processing circuit of the third lane circuit module has an output terminal coupled to an input terminal of a second processing circuit of the fourth lane circuit module, wherein the input terminal of the first information register is coupled to the first processing circuit of the second lane circuit module through the first processing circuit of the third lane circuit module and the first processing circuit of the fourth lane circuit module, and wherein the input terminal of the second information register is coupled to the second processing circuit of the second lane circuit module through the second processing circuit of the third lane circuit module and the second processing circuit of the fourth lane circuit module.

4. The multi-lane data processing circuit according to claim 1, wherein each control circuit is coupled to the first and second processing circuits corresponding to the lane circuit module, and selectively enables one or more of the first and second processing circuits corresponding to the lane circuit module according to a lane control signal.

5. The multi-lane data processing circuit according to claim 4, wherein when the lane control signal indicates executing a first process, the control circuits of the plurality of lane circuit modules enable the first processing circuits of the plurality of lane circuit modules, and couple the first processing circuits of the plurality of lane circuit modules to the plurality of lanes, respectively, and process different data sets of the plurality of lanes in a parallel manner.

6. A multi-lane data processing system comprising:
a plurality of physical layer circuit modules coupled to a plurality of lanes of a data interface in a parallel manner; and
a multi-lane data processing circuit,
wherein the multi-lane data processing circuit comprises:
a plurality of lane circuit modules coupled respectively to the plurality of lanes through the plurality of physical layer circuit modules;
a plurality of registers configured to be connected to the plurality of lane circuit modules; and
a plurality of control circuits comprised in each of the plurality of lane circuit modules and configured to control corresponding lane circuit module,
wherein the plurality of lane circuit modules comprise a first lane circuit module and a second lane circuit module, each of the lane circuit modules comprises a first processing circuit and a second processing circuit, the first processing circuit of the first lane circuit module has an output terminal coupled to an input terminal of the first processing circuit of the second lane circuit module, and the second processing circuit of the first lane circuit module has an output terminal coupled to an input terminal of the second processing circuit of the second lane circuit module, and wherein the plurality of registers comprise a first information register and a second information register, the first information register has an input terminal coupled to an output terminal of the first processing circuit of the second lane circuit module and an output terminal coupled to an input terminal of the first processing circuit of the first lane circuit module, and the second information register has an input terminal coupled to an output terminal of the second processing circuit of the second lane circuit module and an output terminal coupled to an input terminal of the first processing circuit of the second lane circuit module.

7. The multi-lane data processing system according to claim 6, wherein the plurality of lane circuit modules further comprises a third lane circuit module, wherein the first processing circuit of the second lane circuit module has an output terminal coupled to an input terminal of a first processing circuit of the third lane circuit module, and the second processing circuit of the second lane circuit module has an output terminal coupled to an input terminal of a second processing circuit of the third lane circuit module, wherein the input terminal of the first information register is coupled to the first processing circuit of the second lane circuit module through the first processing circuit of the third lane circuit module, and wherein the input terminal of the second information register is coupled to the second processing circuit of the second lane circuit module through the second processing circuit of the third lane circuit module.

8. The multi-lane data processing system according to claim 7, wherein the plurality of lane circuit modules further comprises a fourth lane circuit module, wherein the first processing circuit of the third lane circuit module has an output terminal coupled to an input terminal of a first processing circuit of the fourth lane circuit module, and the second processing circuit of the third lane circuit module has an output terminal coupled to an input terminal of a second processing circuit of the fourth lane circuit module, wherein the input terminal of the first information register is coupled to the first processing circuit of the second lane circuit module through the first processing circuit of the third lane circuit module and the first processing circuit of the fourth lane circuit module, and wherein the input terminal of the second information register is coupled to the second processing circuit of the second lane circuit module through the second processing circuit of the third lane circuit module and the second processing circuit of the fourth lane circuit module.

9. The multi-lane data processing system according to claim 6, wherein each control circuit is coupled to the first and second processing circuits corresponding to the lane circuit module, and selectively enables one or more of the first and second processing circuits corresponding to the lane circuit module according to a lane control signal.

10. The multi-lane data processing system according to claim 9, wherein when the lane control signal indicates executing a first process, the control circuits of the plurality of lane circuit modules enable the first processing circuits of the plurality of lane circuit modules, and couple the first processing circuits of the plurality of lane circuit modules to the plurality of lanes, respectively, through the plurality of physical layer circuit modules and process different data sets of the plurality of lanes in a parallel manner.

11. The multi-lane data processing system according to claim 9, wherein the plurality of physical layer circuit modules are transmitter physical layer circuits.

12. The multi-lane data processing system according to claim 9, wherein the plurality of physical layer circuit modules are receiver physical layer circuits.

13. A multi-lane data processing system coupled to N number of lanes, the system comprising:
  N number of lane circuit modules each including M number of processing circuits and respectively configured to receive data from the lanes, each of N and M being 2 or greater;
  M number of registers, and
  N number of control circuits comprised in each of the N number of lane circuit modules and configured to control corresponding lane circuit module,
wherein a $P^{th}$ one among the registers and a $P^{th}$ processing circuit among the processing circuits within each of the lane circuit modules are coupled to configure a cascade structure such that the $P^{th}$ register outputs data into the $P^{th}$ processing circuit of a first one among the lane circuit modules and the $P^{th}$ processing circuit of a last one among the lane circuit modules outputs data into the $P^{th}$ register,
wherein each of the processing circuits of $Q^{th}$ lane circuit module, Q being 2 or greater and N or less, is configured to process data provided from a $(Q-1)^{th}$ lane circuit module and output the processed data to a $(Q+1)^{th}$ lane circuit module, and
wherein each of the processing circuits is further configured to receive the data from a corresponding one among the lanes and configured to externally output the processed data.

* * * * *